United States Patent
Hu et al.

(10) Patent No.: US 8,946,564 B2
(45) Date of Patent: Feb. 3, 2015

(54) PACKAGING SUBSTRATE HAVING EMBEDDED THROUGH-VIA INTERPOSER AND METHOD OF FABRICATING THE SAME

(75) Inventors: Dyi-Chung Hu, Taoyuan (TW); Tzyy-Jang Tseng, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 96 days.

(21) Appl. No.: 13/604,968

(22) Filed: Sep. 6, 2012

(65) Prior Publication Data
US 2013/0105213 A1     May 2, 2013

(30) Foreign Application Priority Data
Oct. 31, 2011   (TW) .............................. 100139667 A

(51) Int. Cl.
| H05K 1/00 | (2006.01) |
| H01L 21/48 | (2006.01) |
| H01L 23/14 | (2006.01) |
| H01L 23/15 | (2006.01) |
| H01L 23/498 | (2006.01) |

(52) U.S. Cl.
CPC .......... *H01L 21/4846* (2013.01); *H01L 23/147* (2013.01); *H01L 23/15* (2013.01); *H01L 23/49822* (2013.01); *H01L 23/49827* (2013.01); *H01L 2224/73204* (2013.01); *H01L 2224/32225* (2013.01); *H01L 2924/15311* (2013.01); *H01L 23/49816* (2013.01); *H01L 2224/131* (2013.01); *H01L 2224/16237* (2013.01)
USPC ............................ 174/264; 174/255; 174/262

(58) Field of Classification Search
CPC ................ H01L 21/48; H01L 21/4846; H01L 23/49827; H01L 23/49822; H01L 23/15; H01L 23/147; H01L 2224/16225; H01L 2224/32225; H01L 2924/15311; H01L 2224/73204; H01L 23/49816; H01L 2924/00014; H05K 2201/096; H05K 1/185; H05K 3/429; H05K 1/115; H05K 2201/09563; H05K 2201/0959; H05K 2201/09536; H05K 3/4069; H05K 3/4061; H05K 3/42
USPC ................. 174/250–268; 361/760, 792–795; 257/774, 698
See application file for complete search history.

(56) References Cited

U.S. PATENT DOCUMENTS

| 6,908,856 B2 * | 6/2005 | Beyne et al. .................. 438/667 |
| 7,462,784 B2 * | 12/2008 | Kariya et al. .................. 174/260 |
| 8,426,961 B2 * | 4/2013 | Shih et al. ...................... 257/698 |
| 2005/0263867 A1 * | 12/2005 | Kambe et al. .................. 257/678 |
| 2007/0256858 A1 | 11/2007 | Kariya et al. |
| 2012/0073870 A1 * | 3/2012 | Jeon et al. ...................... 174/262 |

* cited by examiner

*Primary Examiner* — Ishwarbhai B Patel
(74) *Attorney, Agent, or Firm* — Mintz Levin Cohn Ferris Glovsky and Popeo, P.C.; Peter F. Corless; Steven M. Jensen

(57) ABSTRACT

A packaging substrate having an embedded through-via interposer is provided, including an encapsulant layer, a through-via interposer embedded in the encapsulant layer and having a plurality of conductive through-vias therein, a redistribution layer embedded in the encapsulant layer and formed on the through-via interposer so as to electrically connect with first end surfaces of the conductive through-vias, and a built-up structure formed on the encapsulant layer and the through-via interposer for electrically connecting second end surfaces of the conductive through-vias. As such, the first end surfaces of the conductive through-vias are electrically connected to the redistribution layer to thereby be electrically connected to electrode pads of a semiconductor chip having smaller pitches, while the second end surfaces of the conductive through-vias electrically connect with conductive vias of the built-up structure having larger pitches, thereby allowing the packaging substrate to be coupled with the semiconductor chip.

6 Claims, 8 Drawing Sheets

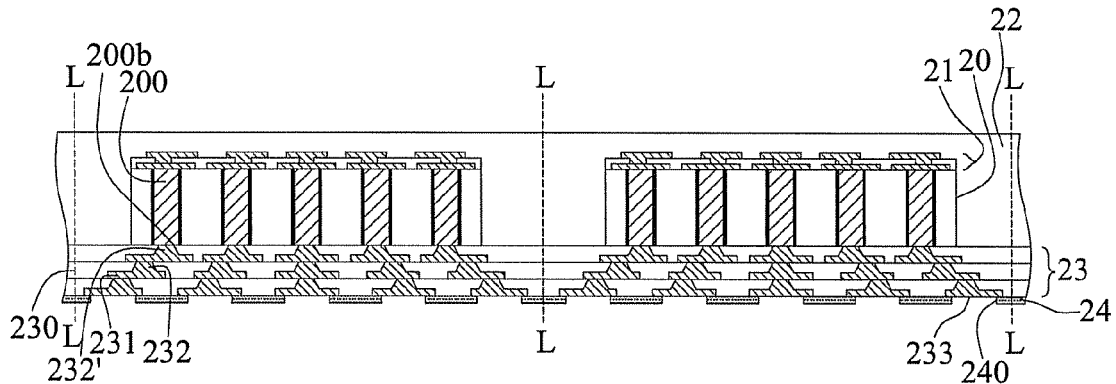
FIG. 2I
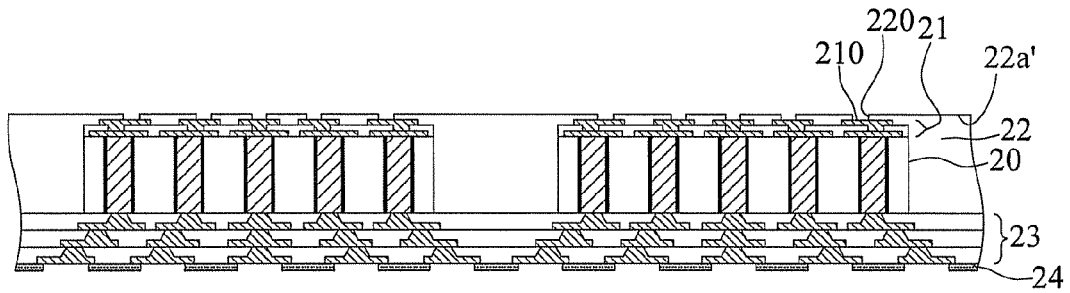
FIG. 2I'
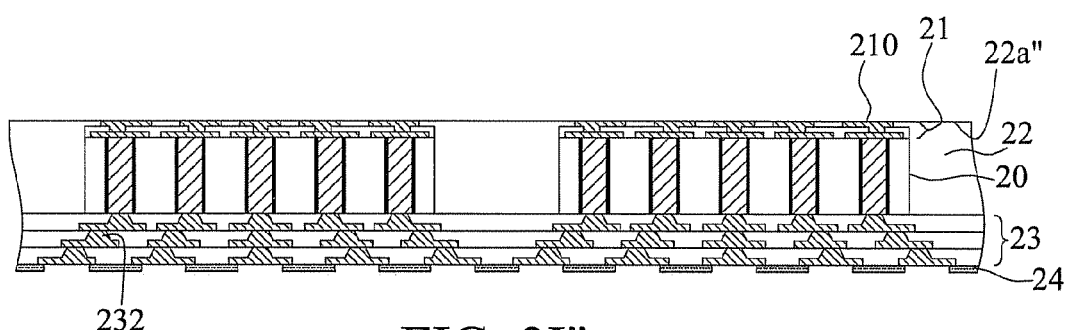
FIG. 2I"

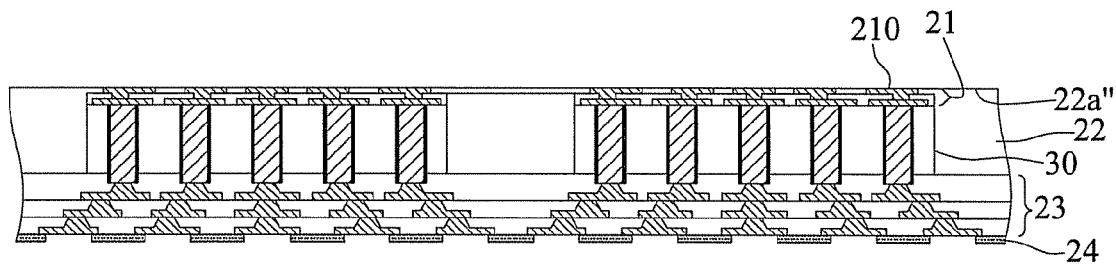
FIG. 3D"
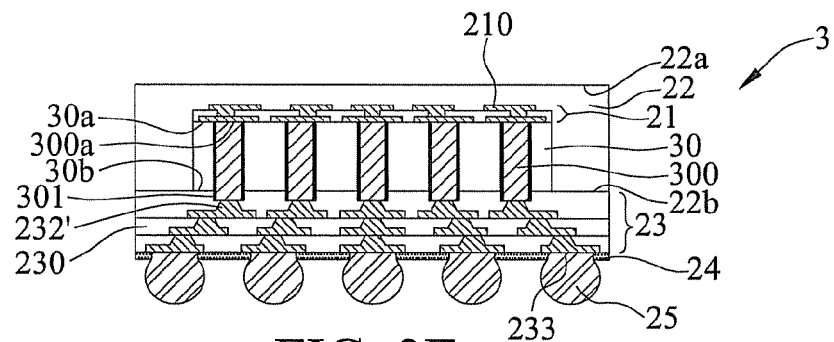
FIG. 3E
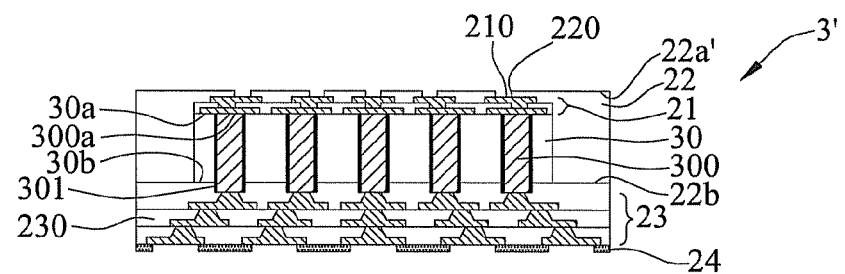
FIG. 3E'
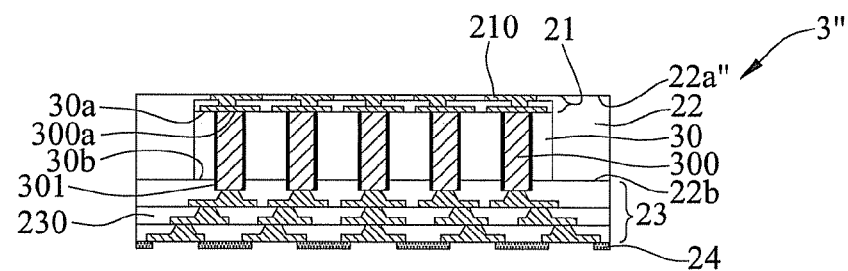
FIG. 3E"

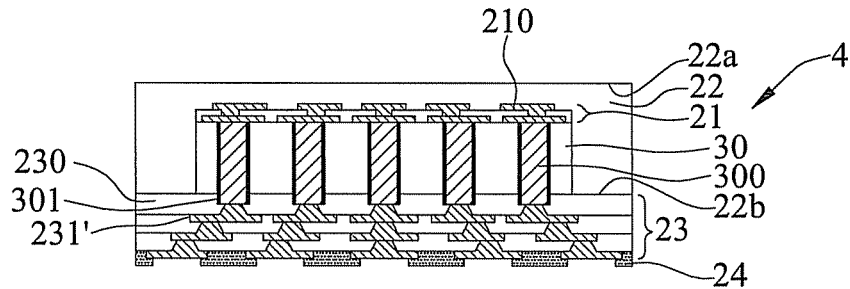
FIG. 4A
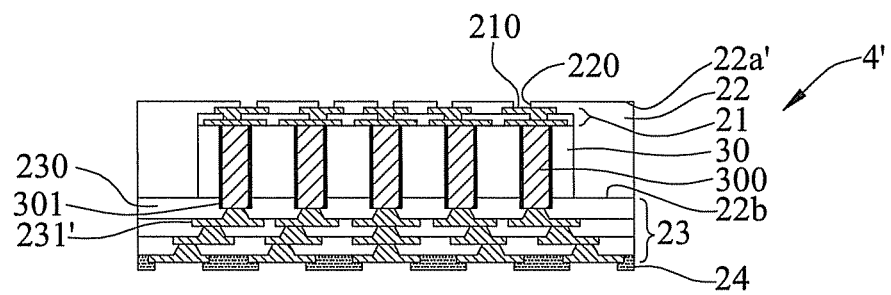
FIG. 4A'
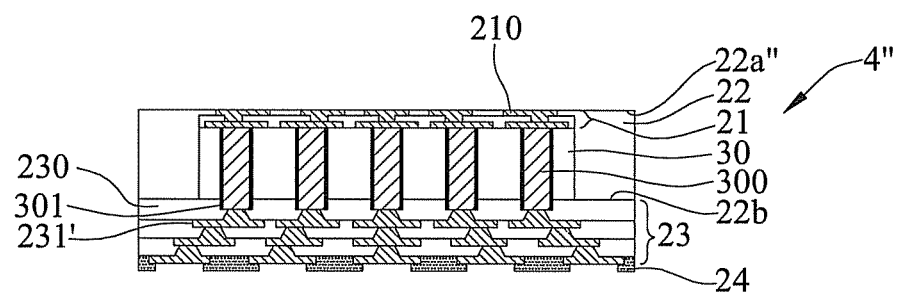
FIG. 4A"

PACKAGING SUBSTRATE HAVING EMBEDDED THROUGH-VIA INTERPOSER AND METHOD OF FABRICATING THE SAME

CROSS-REFERENCES TO RELATED APPLICATIONS

This application claims under 35 U.S.C. §119(a) the benefit of Taiwanese Application No. 100139667, filed Oct. 31, 2011, the entire contents of which is incorporated herein by reference.

BACKGROUND OF THE INVENTION

1. Field of the Invention

The present invention relates to packaging substrates and methods of fabricating the same, and, more particularly, to a packaging substrate having an embedded through-via interposer for carrying a semiconductor chip and a method of fabricating the same.

2. Description of Related Art

FIG. 1 is a schematic cross-sectional view of a conventional flip-chip package structure. In fabrication, a bismaleimide-triazine (BT) packaging substrate 10 that has a core board 102, a first surface 10a and a second surface 10b is provided, and a plurality of flip-chip bonding pads 100 are formed on the first surface 10a of the packaging substrate 10; the flip-chip bonding pads 100 are electrically connected to conductive lands 120 of a semiconductor chip 12 through a plurality of solder bumps 11; then, an underfill 17 is applied to fill the gap between the first surface 10a of the packaging substrate 10 and the semiconductor chip 12 for encapsulating the solder bumps 11; and the second surface 10b of the packaging substrate 10 has a plurality of solder pads 101 so as for solder balls 13 to be mounted thereon and electrically connect the solder pads 101 to another electronic device such as a printed circuit board (not shown).

To improve the electrical performance of the semiconductor chip 12, a dielectric material having an extreme low k (ELK) or an ultra low k (ULK) is usually used in a back-end of line (BEOL) of the semiconductor chip 12. However, such a low-k dielectric material is porous and brittle. Therefore, during a thermal cycling test for reliability characterization of the flip-chip packaging structure, the solder bumps 11 easily crack due to uneven thermal stresses caused by a significant difference between the thermal expansion coefficients (CTE) of the packaging substrate 10 and the semiconductor chip 12, thereby easily causing the semiconductor chip 12 to crack and hence reducing the product reliability.

Further, along with the development of thin-profiled and compact-sized electronic products having a variety of functions, the semiconductor chip 12 has to have a high density of nano-scale circuits and thus reduced pitches between the conductive lands 120. However, the flip-chip bonding pads 100 of the packaging substrate 10 are of micro-scale pitches, which do not match the high-density nano-scale circuits of the semiconductor chip 12.

Therefore, there is a need to provide a packaging substrate and a method of fabricating the same so as to overcome the above-described drawbacks.

SUMMARY OF THE INVENTION

Accordingly, the present invention provides a packaging substrate having an embedded through-via interposer, comprising: an encapsulant layer having opposite first and second surfaces; a through-via interposer embedded in the encapsulant layer and having opposite first and second sides and a plurality of conductive through-vias in communication with the first and second sides, wherein each of the conductive through-vias has a first end surface on the first side of the through-via interposer and a second end surface on the second side of the through-via interposer, and the second side of the through-via interposer is flush with the second end surfaces of the conductive through-vias and the second surface of the encapsulant layer; a redistribution layer embedded in the encapsulant layer and formed on the first side of the through-via interposer and the first end surfaces of the conductive through-vias so as to electrically connect with the first end surfaces of the conductive through-vias, wherein the outermost layer of the redistribution layer has electrode pads; and a built-up structure formed on the second surface of the encapsulant layer, the second side of the through-via interposer and the second end surfaces of the conductive through-vias, and having at least a dielectric layer, a circuit layer embedded in the dielectric layer and a plurality of conductive vias formed in the dielectric layer for electrically connecting with the circuit layer, wherein portions of the conductive vias electrically connect with the second end surfaces of the conductive through-vias, respectively.

The present invention provides another packaging substrate having an embedded through-via interposer, comprising: an encapsulant layer having opposite first and second surfaces; a through-via interposer embedded in the encapsulant layer and having opposite first and second sides and a plurality of conductive through-vias in communication with the first and second sides, wherein each of the conductive through-vias has a first end surface on the first side of the through-via interposer and a second end surface on the second side of the through-via interposer, the second side of the through-via interposer is exposed from the second surface of the encapsulant layer, and the second end surfaces of the conductive through-vias protrude above the second side of the through-via interposer and the second surface of the encapsulant layer to serve as conductive bumps; a redistribution layer embedded in the encapsulant layer and formed on the first side of the through-via interposer and the first end surfaces of the conductive through-vias so as to electrically connect with the first end surfaces of the conductive through-vias, wherein the outermost layer of the redistribution layer has electrode pads; and a built-up structure formed on the second surface of the encapsulant layer, the second side of the through-via interposer and the conductive bumps, and having at least a dielectric layer, a circuit layer formed on the dielectric layer and a plurality of conductive vias formed in the dielectric layer for electrically connecting with the circuit layer, wherein portions of the conductive vias electrically connect with the conductive bumps, respectively.

The present invention further provides a method of fabricating a packaging substrate having an embedded through-via interposer, comprising: providing a through-via interposer having opposite first and second sides and a plurality of conductive through-vias in communication with the first and second sides, wherein each of the conductive through-vias has a first end surface on the first side of the through-via interposer and a second end surface on the second side of the through-via interposer, and the second end surfaces of the conductive through-vias are flush with the second side of the through-via interposer; forming a redistribution layer on the first side of the through-via interposer and the first end surfaces of the conductive through-vias such that the redistribution layer electrically connects with the first end surfaces of the conductive through-vias, wherein the outermost layer of the redistribution layer has electrode pads; forming an encapsulant layer to encapsulate and embed the through-via interposer, wherein the encapsulant layer has opposite first and second surfaces, and the second side of the through-via interposer and the second end surfaces of the conductive through-vias are flush with the second surface of the encapsulant layer, and the encapsulant layer covers the redistribution layer and the electrode pads; and forming a built-up structure on the second surface of the encapsulant layer, the second side of the through-via interposer and the second end surfaces of the conductive through-vias, wherein the built-up structure has at least a dielectric layer, a circuit layer embedded in the dielectric layer and a plurality of conductive vias formed in the dielectric layer for electrically connecting with the circuit layer, wherein portions of the conductive vias electrically connect with the second end surfaces of the conductive through-vias, respectively.

The present invention further provides another method of fabricating a packaging substrate having an embedded through-via interposer, comprising: providing a through-via interposer having opposite first and second sides and a plurality of conductive through-vias in communication with the first and second sides, wherein each of the conductive through-vias has a first end surface on the first side of the through-via interposer and a second end surface on the second side of the through-via interposer, and the second end surfaces of the conductive through-vias protrude above the second side of the through-via interposer to serve as conductive bumps; forming a redistribution layer on the first side of the through-via interposer and the first end surfaces of the conductive through-vias such that the redistribution layer electrically connects with the first end surfaces of the conductive through-vias, wherein the outermost layer of the redistribution layer has electrode pads; forming an encapsulant layer to encapsulate and embed the through-via interposer, wherein the encapsulant layer has opposite first and second surfaces, the second side of the through-via interposer is exposed from the second surface of the encapsulant layer, the conductive bumps protrude above the second surface of the encapsulant layer, and the encapsulant layer covers the redistribution layer and the electrode pads; and forming a built-up structure on the second surface of the encapsulant layer, the second side of the through-via interposer and the conductive bumps, wherein the built-up structure has at least a dielectric layer, a circuit layer formed on the dielectric layer and a plurality of conductive vias formed in the dielectric layer for electrically connecting with the circuit layer, wherein portions of the conductive vias electrically connect with the conductive bumps, respectively.

According to the present invention, first end surfaces of the conductive through-vias of the through-via interposer electrically connect with the redistribution layer to thereby electrically connect to electrode pads of a semiconductor chip having smaller pitches, and second end surfaces of the conductive through-vias electrically connect with the conductive vias of the built-up structure having larger pitches, thereby allowing the packaging substrate to be coupled with the semiconductor chip having high-density circuits. Therefore, the present invention overcomes the conventional drawback of mismatch between packaging substrates and semiconductor chips having high-density circuits without changing original supply chains and infrastructures of IC industries.

Further, if a semiconductor chip is disposed on the through-via interposer, since the CTEs of the through-via interposer and the semiconductor chip are close to each other, cracking of solder bumps between the semiconductor chip and the through-via interposer is prevented, thereby effectively improving the product reliability.

Furthermore, the present invention embeds the through-via interposer in the encapsulant layer so as to reduce the thickness of the overall structure. In addition, since the built-up structure is formed on the second surface of the encapsulant layer, the present invention eliminates the need of a core board as in the prior art, which also facilitates reduction of the thickness of the overall structure.

BRIEF DESCRIPTION OF DRAWINGS

FIGS. 3A to 3E are schematic cross-sectional views illustrating a method of fabricating a packaging substrate having an embedded through-via interposer according to a second embodiment of the present invention, wherein FIGS. 3D' and 3D" show different embodiments from FIG. 3D, and FIGS. 3E' and 3E" show different embodiments from FIG. 3E; and FIGS. 4A, 4A' and 4A" are schematic cross-sectional views showing a packaging substrate having an embedded through-via interposer according to a third embodiment of the present invention.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms, such as "one," "on," "top," "bottom," etc., are merely for illustrative purpose and should not be construed to limit the scope of the present invention.

FIGS. 2A to 2J are schematic cross-sectional views illustrating a method of fabricating a packaging substrate having an embedded through-via interposer according to a first embodiment of the present invention.

Figure 1:
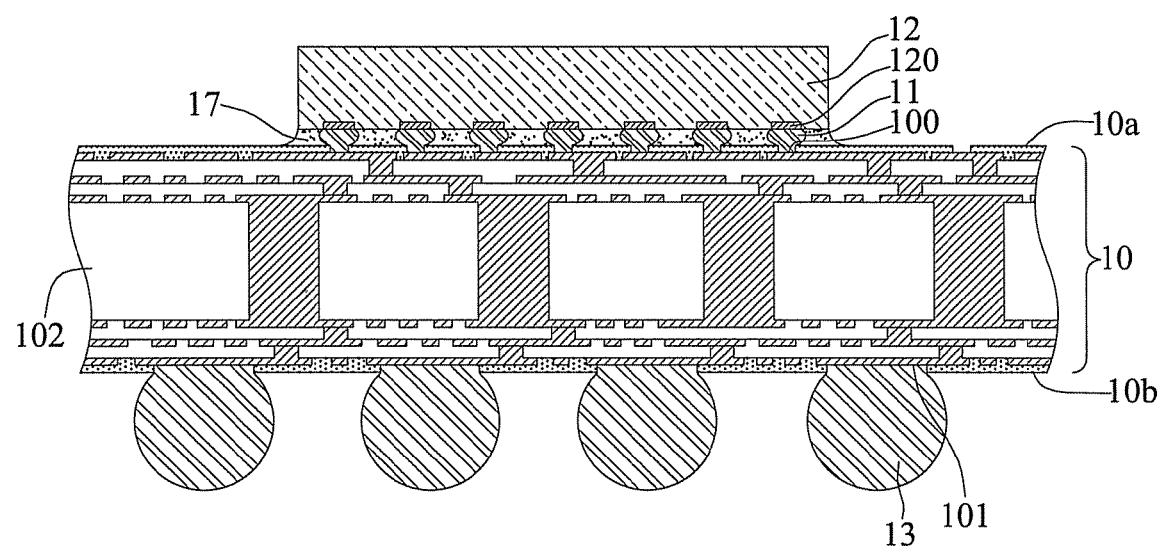
FIG. 1 is a schematic cross-sectional view showing a conventional flip-chip package structure.
Figure 2A:
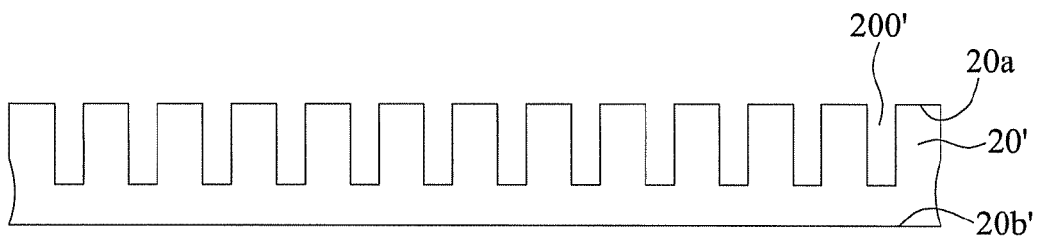
FIGS. 2A to 2J are schematic cross-sectional views illustrating a method of fabricating a packaging substrate having an embedded through-via interposer according to a first embodiment of the present invention, wherein FIGS. 2I' and 2I" show different embodiments from FIG. 2I, and FIGS. 2J', 2J" and 2K show different embodiments from FIG. 2J.

Referring to FIG. 2A, an interposer 20' is provided. The interposer 20' has opposite first side 20a and second side 20b'. A plurality of through-vias 200' are formed at the first side 20a of the interposer 20'.

In an embodiment, the interposer 20' is made of silicon.

Figure 2B:
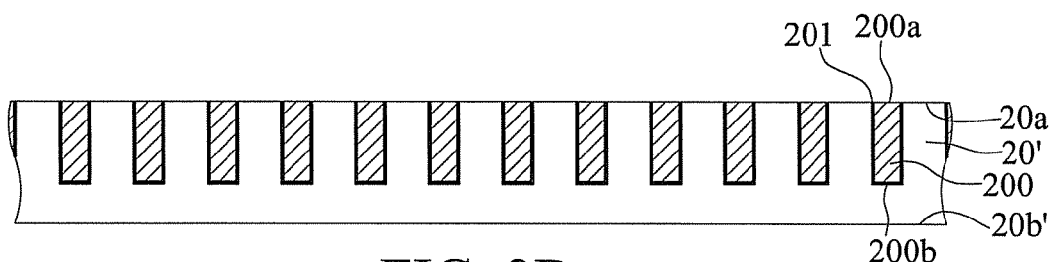

Referring to FIG. 2B, an insulating layer 201 is formed on sidewalls and bottom portions of the through-vias 200', and a copper material is applied to fill the through-vias 200' so as to form a plurality of conductive through-vias 200. Each of the conductive through-vias 200 has a first end surface 200a and a second end surface 200b corresponding to the first side 20a and the second side 20b' of the interposer 20', respectively.

In an embodiment, the conductive through-vias 200 are made of Ni, Au, W, Al or a conductive paste, and insulating layer 201 is made of $SiO_2$, $Si_3N_4$ or a polymer material. Further, the first end surfaces 200a of the conductive through-vias 200 are flush with the first side 20a of the interposer 20'.

In another embodiment, the interposer 20' is made of an insulating material, such as a glass material or a ceramic material, such as $Al_2O_3$ and AlN. As such, the conductive through-vias 200 are directly formed in the interposer 20' without the need of formation of the insulating layer 201. Since related techniques are well known in the art, detailed description thereof is omitted.

Figure 2C:
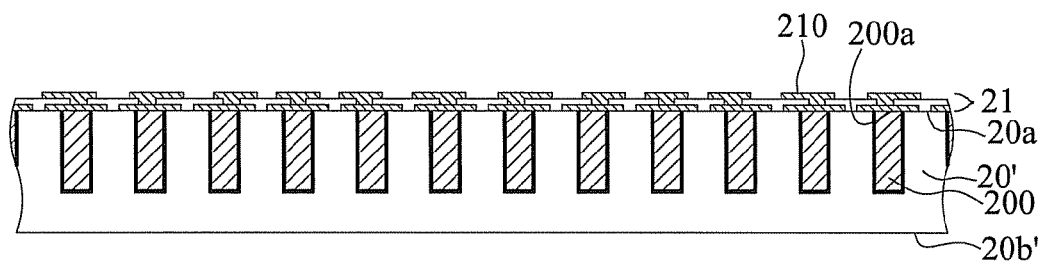

Referring to FIG. 2C, a redistribution layer (RDL) 21 is formed on the first side 20a of the interposer 20' and the first end surfaces 200a of the conductive through-vias 200 such that the redistribution layer 21 electrically connects with the first end surfaces 200a of the conductive through-vias 200. The outermost layer of the redistribution layer 21 has a plurality of electrode pads 210.

Figure 2D:
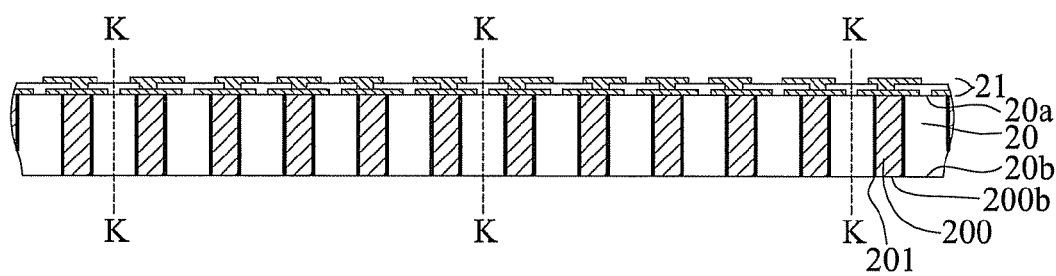

Referring to FIG. 2D, the first side 20a of the interposer 20' and the redistribution layer 21 are attached to a carrier (not shown), and the second side 20b of the interposer 20' is polished, such that the second end surfaces 200b of the conductive through-vias 200 are exposed from the second side 20b of the interposer 20'. Then, the carrier is removed. Through the above-described fabrication processes, the through-via interposer 20 is obtained.

In an embodiment, the second end surfaces 200b of the conductive through-vias 200 are flush with the second side 20b of the interposer 20, and the conductive through-vias 200 are in communication with the first side 20a and the second side 20b of the interposer 20. In addition, the insulating layer 201 is formed only on the sidewalls of the conductive through-vias 200.

Furthermore, the carrier is made of a material that is the same as or similar to the interposer 20'. For example, the carrier is made of silicon or an insulating material, such as a glass material or a ceramic material, such as $Al_2O_3$ and AlN, thereby facilitating the bonding between the carrier and the interposer 20'. In an embodiment, the carrier is made of a glass material.

In an embodiment, the carrier is adhered to the interposer 20'.

Figure 2E:
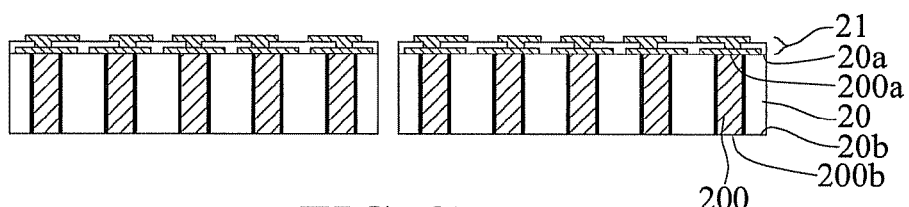

Referring to FIG. 2E, a plurality of interposers 20 are obtained by cutting along imaginary scribing lines K.

Figure 2F:
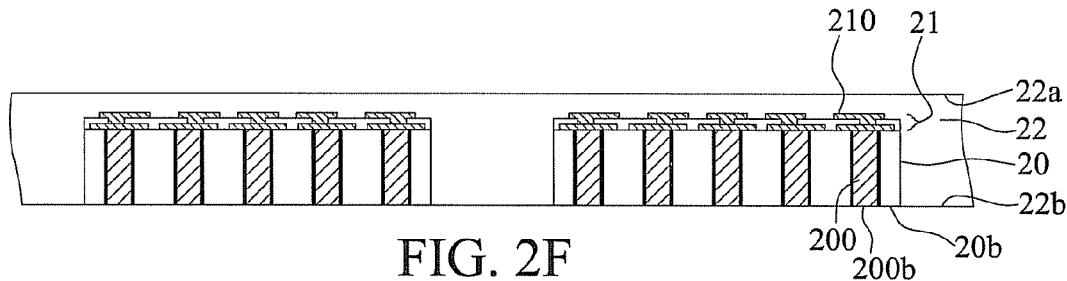

Referring to FIG. 2F, the through-via interposers 20 are rearranged on a glass carrier (not shown), with the second sides 20b of the through-via interposers 20 and the second end surfaces 200b of the conductive through-vias 200 bonded with the glass carrier. Then, an encapsulant layer 22 is formed to encapsulate the through-via interposers 20 such that the through-via interposers 20 are embedded in the encapsulant layer 22. Subsequently, the glass carrier is removed.

In an embodiment, the encapsulant layer 22 has opposite first surface 22a and second surfaces 22b. The second sides 20b of the interposers 20 and the second end surfaces 200b of the conductive through-vias 200 are flush with the second surface 22b of the encapsulant layer 22, and the encapsulant layer 22 covers the redistribution layer 21 and the electrode pads 210.

Figure 2G:
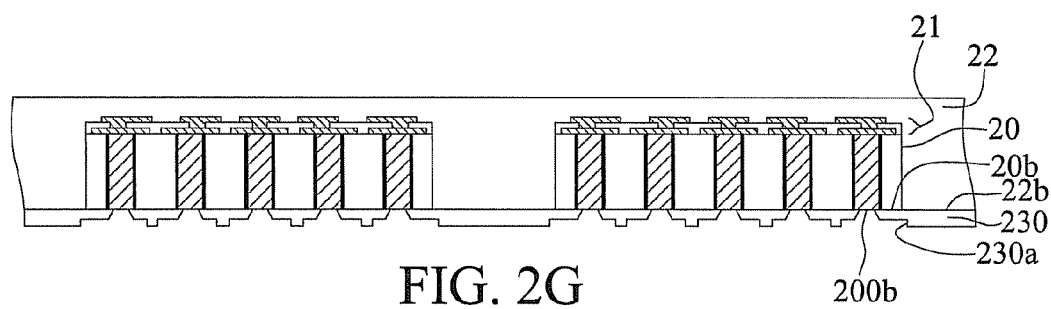
Figure 2H:
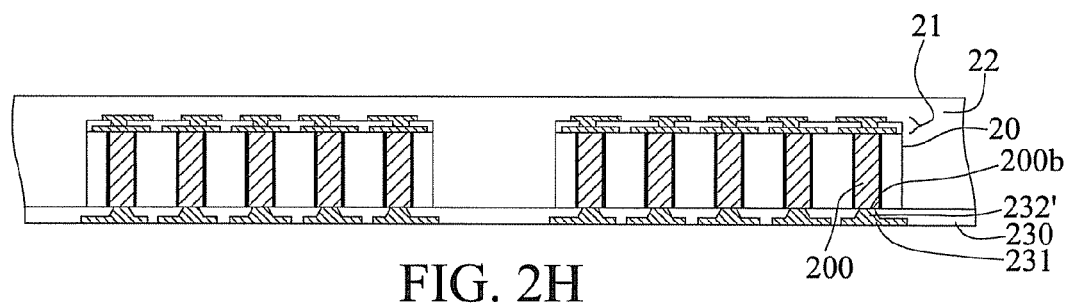

Referring to FIGS. 2G to 2I, a built-up structure 23 is formed on the second surface 22b of the encapsulant layer 22, the second sides 20b of the interposers 20, and the second end surfaces 200b of the conductive through-vias 200.

Referring to FIG. 2G, a dielectric layer 230 such as an ajinomoto build-up film (ABF) is formed, and a plurality of circuit intaglios (including vias) 230a are formed in the dielectric layer 230 by a laser technique for the second end surfaces 200b of the conductive through-vias 200 to be exposed therefrom. In an embodiment, the dielectric layer 230 is formed by coating or lamination technique, and made of polyimide (PI), prepreg (PP) or benzocyclobutene (BCB).

Referring to FIG. 2H, a circuit layer 231 and a plurality of conductive vias 232' are formed in the circuit intaglios 230a by an electroplating technique such that the circuit layer 231 is embedded in the dielectric layer 230 and the conductive vias 232' electrically connect with the second end surfaces 200b of the conductive through-vias 200. In an embodiment, a copper material is applied on the dielectric layer 230 and in the circuit intaglios 230a to serve as a conductive layer (not shown), and a metal material is applied on the dielectric layer 230 and in the circuit intaglios 230a by an electroplating technique, thereby forming the circuit layer 231 and the conductive vias 232'. Finally, portions of the metal material and the conductive layer disposed on the dielectric layer 230 are removed.

The present invention eliminates the need to use an etching technique to form the circuit layer 231, thereby avoiding side-etching of circuits by an etching solution and avoiding fabricating circuits of large size. Therefore, when the through-via interposer 20 of small size is used, high precision circuits can be fabricated to electrically connect with the conductive through-vias 200.

Referring to FIG. 2I, a multi-layer circuit structure may be formed according to practical needs. In an embodiment, the built-up structure 23 has at least a dielectric layer 230, a circuit layer 231 embedded in the dielectric layer 230, and a plurality of conductive vias 232 formed in the dielectric layer 230 and electrically connected with the circuit layer 231. Portions of the conductive vias 232' electrically connect with the second end surfaces 200b of the conductive through-vias 200.

Further, an insulating protective layer 24 is formed on the built-up structure 23, and a plurality of openings 240 are formed in the insulating protective layer 24 such that portions of the circuit layer 231 are exposed from the openings 240 to serve as conductive pads 233.

In other embodiments, the thickness of the encapsulant layer 22 may be decreased from the first surface 22a thereof so as to expose the electrode pads 210 from the first surface 22a' 22a", thereby allowing a semiconductor chip (not shown) to be mounted thereon. Referring to FIG. 2I', a plurality of openings 220 are formed on the first surface 22a' of the encapsulant layer 22 for the electrode pads 210 to be exposed from the openings 220. Alternatively, as shown in FIG. 2I", the first surface 22a" of the encapsulant layer 22 is flush with or lower than the electrode pads 210 so as for the electrode pads 210 to be exposed from the first surface 22a" of the encapsulant layer 22.

Figure 2J:
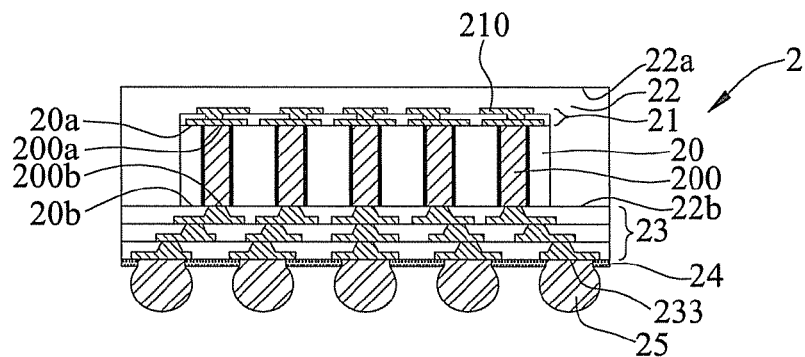
Figure 2J:
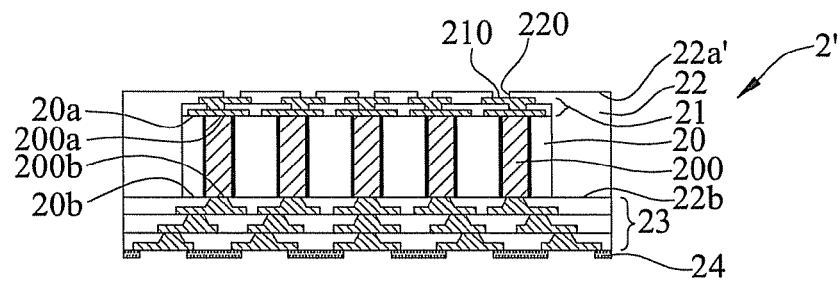
Figure 2J:
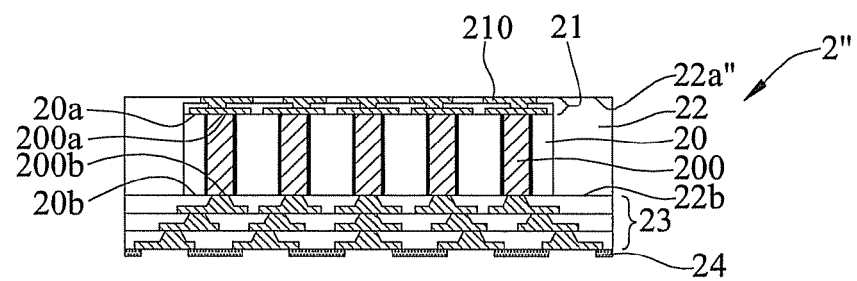

Referring to FIGS. 2J, 2J' and 2J", the structure of FIGS. 2I, 2I' or 2I" is singulated along imaginary scribing lines L of FIG. 2I so as to obtain a plurality of packaging substrates 2, 2' or 2" having an embedded through-via interposer 20.

Before or after the singulation process, a plurality of solder balls 25 can be mounted on the conductive pads 233 for other electronic devices such as printed circuit boards or semiconductor packages to be mounted thereon.

Figure 2K:
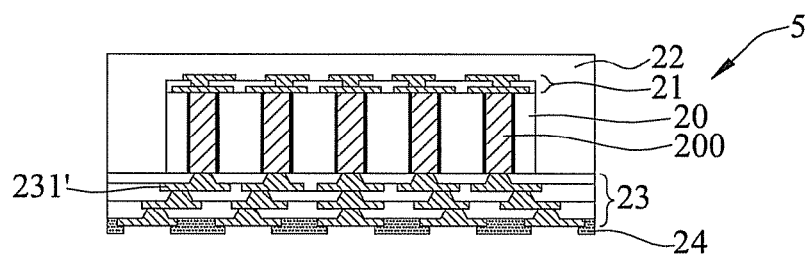

As shown in FIG. 2K, in a packaging substrate 5 according to another embodiment the circuit layer 231' of the built-up structure 23 is formed on the surface of the dielectric layer 230 instead of being embedded in the dielectric layer 230.

The present invention further provides a packaging substrate 2, 2', 2" having an embedded through-via interposer 20. The packaging substrate 2, 2', 2" comprises an encapsulant layer 22 having a first surface 22a, 22a', 22a" and an opposite second surface 22b; a through-via interposer 20 embedded in the encapsulant layer 22, a redistribution layer 21 embedded in the encapsulant layer 22 and formed on the through-via interposer 20, a built-up structure 23 formed on the second surface 22b of the encapsulant layer 22, and an insulating protective layer 24 formed on the built-up structure 23.

The through-via interposer 20 has opposite first surface 20a and second side 20b, and a plurality of conductive through-vias 200 in communication with the first side 20a and the second side 20b. Each of the conductive through-vias 200 has a first end surface 200a on the first side 20a of the through-via interposer 20, and a second end surface 200b on the second side 20b of the through-via interposer 20, and an insulating layer 201 is formed on the sidewall of the conductive through-via 200. The second side 20b of the through-via interposer 20 and the second end surfaces 200b of the conductive through-vias 200 are flush with the second surface 22b of the encapsulant layer 22.

The redistribution layer 21 is disposed on the first side 20a of the through-via interposer 20 and the first end surfaces 200a of the conductive through-vias 200 and electrically connects with the first end surfaces 200a of the conductive through-vias 200. The outermost layer of the redistribution layer 21 has a plurality of electrode pads 210.

The encapsulant layer 22 covers the electrode pads 210, as shown in FIG. 2J. Alternatively, referring to FIGS. 2J' and 2J", the electrode pads 210 are exposed from the first surface 22a', 22a" of the encapsulant layer 22.

The built-up structure 23 is further formed on the second side 20b of the through-via interposer 20 and the second end surfaces 200b of the conductive through-vias 200. The built-up structure 23 has at least a dielectric layer 230, a circuit layer 231 embedded in the dielectric layer 230, and a plurality of conductive vias 232 formed in the dielectric layer 230 and electrically connecting with the circuit layer 231. Portions of the conductive vias 232' electrically connected with the second end surfaces 200b of the conductive through-vias 200.

The insulating protective layer 24 has a plurality of openings 240 such that portions of the circuit layer 231 are exposed from the openings 240 to serve as conductive pads 233.

According to the present invention, the first end surfaces 200a of the conductive through-vias 200 electrically connect with the redistribution layer 21 to thereby electrically connect to the electrode pads of a semiconductor chip (not shown) that have smaller pitches, and the other end surfaces 200b of the conductive through-vias 200 electrically connect with the conductive vias 232' of the built-up structure 23 that have larger pitches, thereby allowing the packaging substrate 2, 2', 2" to be coupled with the semiconductor chip having high-density circuits.

Further, the through-via interposer 20 and the semiconductor chip have CTEs of about 2.6 ppm and are close to each other, cracking of solder bumps between the semiconductor chip and the through-via interposer 20 is prevented, thereby effectively improving the product reliability.

Furthermore, the present invention embeds the through-via interposer 20 in the encapsulant layer 22 so as to reduce the thickness of the overall structure. In addition, since the built-up structure 23 is formed on the second surface 22b of the encapsulant layer 22, the present invention eliminates the need of a core board as in the prior art, which also facilitates reduction of the thickness of the overall structure.

FIGS. 3A to 3E are schematic cross-sectional views illustrating a method of fabricating a packaging substrate 3 having an embedded through-via interposer 30 according to a second embodiment of the present invention. The second embodiment differs from the first embodiment in that the through-via interposer 30 of the second embodiment has a plurality of conductive bumps 301.

Figure 3A:
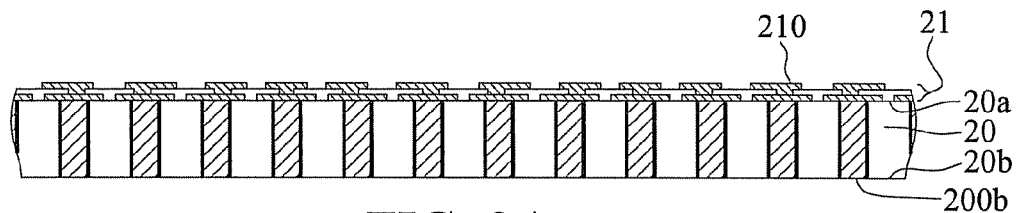

Referring to FIG. 3A, a through-via interposer 20 as shown in FIG. 2D is provided.

Figure 3B:
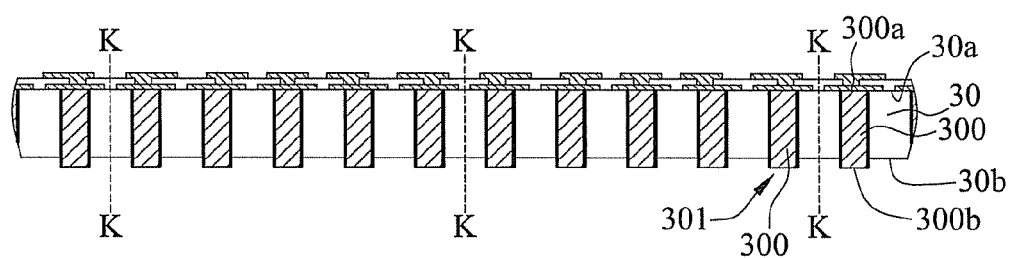

Referring to FIG. 3B, portions of the second side 20b of the through-via interposer 20 are removed such that the second end surfaces 300b of the conductive through-vias 300 protrude above the second side 30b of the through-via interposer 30. The protruding portions of the conductive through-vias 300 serve as conductive bumps 301 (including the insulating layer 201).

Figure 3C:
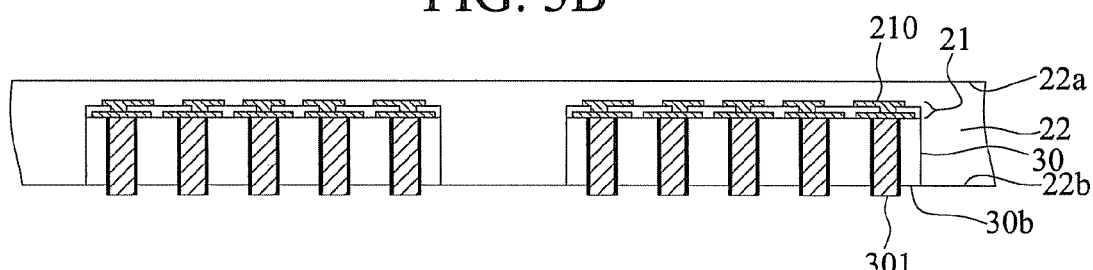

Referring to FIG. 3C, the structure is singulated along imaginary scribing lines K of FIG. 3B to obtain a plurality of through-via interposers 30.

Then, an encapsulate layer 22 having opposite first side 22a and second surface 22b is formed to encapsulate and embed the through-via interposers 30. The second sides 30b of the through-via interposers 30 are exposed from the second surface 22b of the encapsulant layer 22, and the conductive bumps 301 protrude from the second surface 22b of the encapsulant layer 22. Further, the encapsulant layer 22 covers the redistribution layer 21 and the electrode pads 210.

Figure 3D:
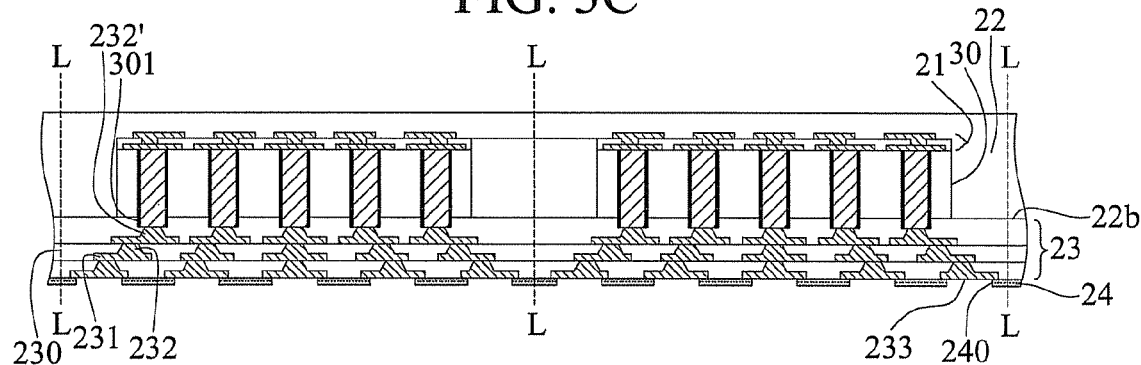
Figure 3D:
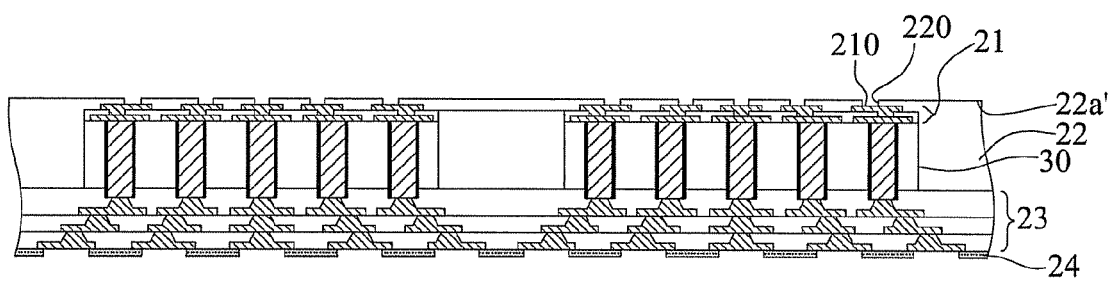

Referring to FIG. 3D, a built-up structure 23 is formed on the second surface 22b of the encapsulant layer 22, the second sides 30b of the through-via interposers 30, and the conductive bumps 301. The built-up structure 23 has at least a dielectric layer 230, a circuit layer 231 embedded in the dielectric layer 230, and a plurality of conductive vias 232 formed in the dielectric layer 230 and electrically connected with the circuit layer 231. Portions of the conductive vias 232' electrically connect with the conductive bumps 301.

Then, an insulating protective layer 24 is formed on the built-up structure 23, and a plurality of openings 240 are formed in the insulating protective layer 24 such that portions of the circuit layer 231 are exposed from the openings 240 to serve as conductive pads 233.

In other embodiments, the thickness of the encapsulant layer 22 are decreased from the first surface 22a thereof so as to expose the electrode pads 210. Referring to FIG. 3D', a plurality of openings 220 are formed on the first surface 22a' of the encapsulant layer 22 for the electrode pads 220 to be exposed from the openings 220. Alternatively, referring to FIG. 3D", the first surface 22a" of the encapsulant layer 22 is flush with or lower than the electrode pads 210 so as to expose the electrode pads 210.

Referring to FIGS. 3E, 3E' and 3E", the structures 3D, 3D' and 3D" are singulated along the imaginary scribing lines L of FIG. 3D so as to obtain a plurality of packaging substrates 3, 3' and 3" having an embedded through-via interposer 30.

Before or after the singulation process, a plurality of solder balls 25 can be mounted on the conductive pads 233 for electrically connecting to other electronic devices such as printed circuit boards or packages.

According to the present embodiment, the second end surfaces 300b of the conductive through-vias 300 protrude above the second sides 30b of the through-via interposers 30 to serve as conductive bumps 301. When the circuit intaglios 230a are formed in the built-up structure 23 via a laser technique, high temperature and pressure generated due the application of the laser technique can be absorbed by the conductive bumps 301 made of a hard material, thereby avoiding damage of the through-via interposers 30 made of a brittle material.

If the second end surfaces 200b of the conductive through-vias 200 are flush with the second side 20b of the through-via interposer 20, as shown in FIG. 3A, conductive bumps can be directly bonded to the second end surfaces 200b of the conductive through-vias 200 instead of removing portions of the through-via interposers 20 from the second sides 20b to form the conductive bumps 301, in order to prevent the interposer 20 from being damaged when the circuit intaglios 230a are formed by a laser technique. However, the conductive bumps thus formed have a height of at least 30 μm, thereby adversely affecting miniaturization of the through-via interposers 30.

If the second end surfaces 200b of the conductive through-vias 200 are flush with the second side 20b of the through-via interposer 20, as shown in FIG. 3A, an electroless nickel/gold process must be performed on the second end surfaces 200b of the conductive through-vias 200 in order to absorb the laser, without the necessity of forming the conductive bumps 301. Consequently, the fabrication cost is increased and the conductive bump must be made of a material having resistance to high process temperature and strong process solution.

FIGS. 4A, 4A' and 4A" are cross-sectional views illustrating a packaging substrates 4, 4' and 4" having an embedded through-via interposer 30 according to a third embodiment of the present invention. The third embodiment differs from the second embodiment in that the circuit layer of the third embodiment is formed on the dielectric layer.

Referring to FIGS. 4A, 4A' and 4A", a circuit layer 231' is formed on the dielectric layer 230 of the built-up structure 23.

The present invention further provides a packaging substrate 3, 3', 3", 4A, 4A', 4A"having an embedded through-via interposer 30. The packaging substrate comprises an encapsulant layer 22 having a first surface 22a, 22a', 22a" and an opposite second surface 22b, a through-via interposer 30 embedded in the encapsulant layer 22, a redistribution layer 21 embedded in the encapsulant layer 22 and formed on the through-via interposer 30, a built-up structure 23 formed on the second surface 22b of the encapsulant layer 22, and an insulating protective layer 24 formed on the built-up structure 23.

The through-via interposer 30 has opposite first side 30a and second side 30b, and a plurality of conductive through-vias 300 in communication with the first side 30a and the second side 30b. Each of the conductive through-vias 300 has a first end surface 300a on the first side 30a of the through-via interposer 30 and a second end surface 300b on the second side 30b of the through-via interposer 30, and an insulating layer 201 is formed on the sidewall of the conductive through-via 300. The second side 30b of the through-via interposer 30 is exposed from the second surface 22b of the encapsulant layer 22. The second end surfaces 300b of the conductive through-vias 300 protrude above the second side 30b of the through-via interposer 30 and the second surface 22b of the encapsulant layer 22 so as to serve as conductive bumps 301.

The redistribution layer 21 is formed on the first side 30a of the through-via interposer 30 and the first end surfaces 300a of the conductive through-vias 300 and electrically connected with the first end surfaces 300a of the conductive through-vias 300. The outermost layer of the redistribution layer 21 has a plurality of electrode pads 210.

The encapsulant layer 22 covers the electrode pads 210, as shown in FIG. 3E. Alternatively, referring to FIGS. 3E' and 3E', the electrode pads 210 are exposed from the first surface 22a', 22a" of the encapsulant layer 22.

The built-up structure 23 is disposed on the second side 30b of the through-via interposer 30 and the second end surfaces 300b of the conductive through-vias 300. The built-up structure 23 has at least a dielectric layer 230, a circuit layer 231 embedded in the dielectric layer 230 (as shown in FIGS. 3E, 3E' and 3E"), and a plurality of conductive vias 232 formed in the dielectric layer 230 for electrically connecting with the circuit layer 231. Portions of the conductive vias 232' electrically connect with the conductive bumps 301. The circuit layer 231' can alternatively be formed on the dielectric layer 230, as shown in FIGS. 4A, 4A' and 4A".

The insulating protective layer 24 has a plurality of openings 240 such that portions of the circuit layer 231 are exposed from the openings 240 to serve as conductive pads 233.

According to the present invention, a through-via interposer is embedded in an encapsulant layer to overcome the conventional drawback of mismatch between packaging substrates and semiconductor chips having high-density circuits without changing original supply chains and infrastructures of IC industries, thereby meeting the demands for miniaturization and low-cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A packaging substrate having an embedded through-via interposer, comprising:
an encapsulant layer having opposite first and second surfaces;
a through-via interposer embedded in the encapsulant layer and having opposite first and second sides and a plurality of conductive through-vias in communication with the first and second sides, wherein each of the conductive through-vias has a first end surface on the first side of the through-via interposer and a second end surface on the second side of the through-via interposer, the second side of the through-via interposer is exposed from the second surface of the encapsulant layer, the second side of the through-via interposer is flush with the second surface of the encapsulant, and the second end surfaces of the conductive through-vias protrude above the second side of the through-via interposer and the second surface of the encapsulant layer to serve as conductive bumps;
a redistribution layer embedded in the encapsulant layer and formed on the first side of the through-via interposer and the first end surfaces of the conductive through-vias so as to electrically connect with the first end surfaces of the conductive through-vias, wherein the outermost layer of the redistribution layer has electrode pads; and
a built-up structure formed on the second surface of the encapsulant layer, the second side of the through-via interposer and the conductive bumps, and having at least a dielectric layer, a circuit layer formed on the dielectric layer and a plurality of conductive vias formed in the dielectric layer for electrically connecting with the circuit layer, wherein portions of the conductive vias electrically connect with the conductive bumps, respectively.

2. The packaging substrate of claim 1, wherein each of the conductive through-vias has an insulating layer formed on a sidewall of the conductive through-via.

3. The packaging substrate of claim 1, further comprising an insulating protective layer formed on the built-up structure and having a plurality of openings formed therein such that portions of the circuit layer of the built-up structure are exposed from the openings to serve as conductive pads.

4. The packaging substrate of claim 1, wherein the circuit layer is embedded in the dielectric layer.

5. The packaging substrate of claim 1, wherein the encapsulant layer covers the electrode pads.

6. The packaging substrate of claim 1, wherein the electrode pads are exposed from the first surface of the encapsulant layer.

* * * * *